United States Patent
Hsu

(10) Patent No.: US 7,002,432 B2
(45) Date of Patent: Feb. 21, 2006

(54) SIGNAL TRANSMISSION STRUCTURE

(75) Inventor: Jimmy Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 60 days.

(21) Appl. No.: 10/767,900

(22) Filed: Jan. 28, 2004

(65) Prior Publication Data

US 2005/0083148 A1   Apr. 21, 2005

(30) Foreign Application Priority Data

Oct. 17, 2003   (TW) ............................... 92128843 A

(51) Int. Cl.
  *H03H 7/38*   (2006.01)
(52) U.S. Cl. .......................... 333/33; 333/32; 333/263
(58) Field of Classification Search .................. 333/33, 333/263, 32
  See application file for complete search history.

(56) References Cited

U.S. PATENT DOCUMENTS

| | | | | |
|---|---|---|---|---|
| 3,573,670 A | * | 4/1971 | Skobern | 333/33 |
| 3,815,055 A | * | 6/1974 | Plunk et al. | 333/128 |
| 5,093,639 A | * | 3/1992 | Franchi et al. | 333/24 R |
| 5,525,953 A | * | 6/1996 | Okada et al. | 333/204 |
| 6,023,210 A | * | 2/2000 | Tulintseff | 333/238 |
| 6,075,647 A | * | 6/2000 | Braun et al. | 359/578 |
| 6,081,241 A | * | 6/2000 | Josefsson et al. | 343/771 |
| 6,781,476 B1 | * | 8/2004 | Tsunoda et al. | 333/110 |

* cited by examiner

*Primary Examiner*—Robert Pascal
*Assistant Examiner*—Kimberly Glenn
(74) *Attorney, Agent, or Firm*—J.C. Patents

(57) ABSTRACT

A signal transmission structure includes at least one reference plane with a non-reference area, and a signal line with a salient protruding over the edge of the signal line and the salient is corresponding to the position of the non-reference area. When a signal passes through the signal line, the effect of the parasitic capacitance between the salient and the reference plane can improve the characteristic impedance mismatch. Therefore, the signal transmission structure can reduce the insertion loss and increase the reduction of the return loss in order to locally compensate the impedance mismatch.

9 Claims, 6 Drawing Sheets

SIGNAL TRANSMISSION STRUCTURE

CROSS-REFERENCE TO RELATED APPLICATION

This application claims the priority benefit of Taiwan application serial no. 92128843, filed on Oct. 17, 2003, the full disclosure of which is incorporated herein by reference.

BACKGROUND OF THE INVENTION

1. Field of the Invention

This invention generally relates to a signal transmission structure, and more particularly to a signal transmission structure for improving the characteristic impedance mismatch of the signal transmission structure.

2. Description of Related Art

The signal line in a printed circuit board with a large scale or a packaging substrate for connecting two devices or two terminals has to maintain a uniform line width in order to keep a constant characteristic impedance when an electronic signal is transmitted in the signal line. A good impedance matching design between the two terminals are required to reduce the reflection due to the impedance mismatch especially when the signal is transmitted in a high speed and a high frequency environment i.e., to reduce the insertion loss and increase the reduction of the return loss when transmitting the signals so that the quality of the signal transmission will not be affected.

FIGS. 1A and 1B show a top view and a side view of a conventional signal line passing through a non-reference area. The signal transmission structure 110 includes at least a reference plane 120 and a signal line 130. The reference plane 120, for example, can be a power plane or a ground plane. The signal line 130 has a uniform line width. It is important to note that in a conventional circuit design, the reference plane can form a plurality of through holes due to the hole drilling or cutting between the planes, or a non-reference area 122 (such as a non-reference area opening) can be formed to prevent adjacent signal lines from short-circuit. Hence, a high impedance occurs at the non-reference area 122 when the signal is transmitted in the signal line 130 so that the impedance mismatch causes the increase of the insertion loss. Therefore, the signal cannot be transmitted without a loss from one terminal of the non-reference area 122 to the other terminal of the non-reference area 122.

FIG. 2A shows the frequency response S21 when the conventional signal line passes through a reference plane (solid line R1) and a non-reference area (solid line T1). Referring to FIGS. 1A and 2A, the return loss is more decreased when the working frequency is high i.e., the distortion is more serious. This is due to that the conventional signal line passing through a non-reference area 122. FIG. 2B shows the frequency response S11 when the conventional signal line passes through a reference plane (solid line C2) and a non-reference area (solid line T2). Referring to FIGS. 1B and 2B, the insertion loss is also increased when the working frequency is high i.e., the distortion is more serious. Again it is due to the conventional signal line passing through a non-reference area 122.

FIG. 2C shows the relationship between the frequency and the characteristic impedance when the conventional signal line passes through a reference plane (solid line R3) and a non-reference area (solid line T3). Referring to FIGS. 1B and 2B, the characteristic impedance is high when the working frequency is high. Once again this is due to the conventional signal line passing through a non-reference area 122. As a result, the impedance mismatch occurs.

In light of the above, the frequency increases, the return loss decreases and the corresponding characteristic impedance increases when the signal line passes through the non-reference area. Hence, the difference in the characteristic impedance from the original design is increased so that the impedance mismatch is much more serious. Therefore and for the foregoing reasons, there is a desperate need for a method or structure that is able to improve the characteristic impedance mismatch when the signal line passes through a non-reference area.

SUMMARY OF THE INVENTION

An object of the present invention is to provide a signal transmission structure for improving the characteristic impedance mismatch when the signal line passes through a non-reference area.

The present invention provides a signal transmission structure for a circuit board, comprising: a reference plane having a non-reference area; and a signal line on a first side of the reference plane, wherein the signal line having at least a salient positioning corresponding to the non-reference area and protruding from a lateral side of the signal line.

In a preferred embodiment of the present invention, the reference plane is one of a power plane and a ground plane; the reference and the signal line can be overlapped but not co-planar; alternatively the reference plane and the signal line can be co-planar. A portion of the salient partially extends to an area outside the non-reference area when the reference and the signal line are overlapped. In addition, the salient extends into the opening forming a distance in between the salient and the reference plane when the reference plane and the signal line are co-planar. The opening forms the non-reference area.

The present invention uses a signal transmission structure with a salient. The position of the salient corresponds to the position of the non-reference area and protrudes from the edge of the signal line. When the signal transmits in the signal line, the parasitic capacitance formed between the salient and the reference plane can improve the characteristic impedance mismatch. To summarize, the signal transmission structure can reduce the insertion loss and increase the reduction of the return loss to locally compensate the impedance mismatch when the signal is transmitted in a high frequency/high speed environment.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

Figures 1A, 1B:
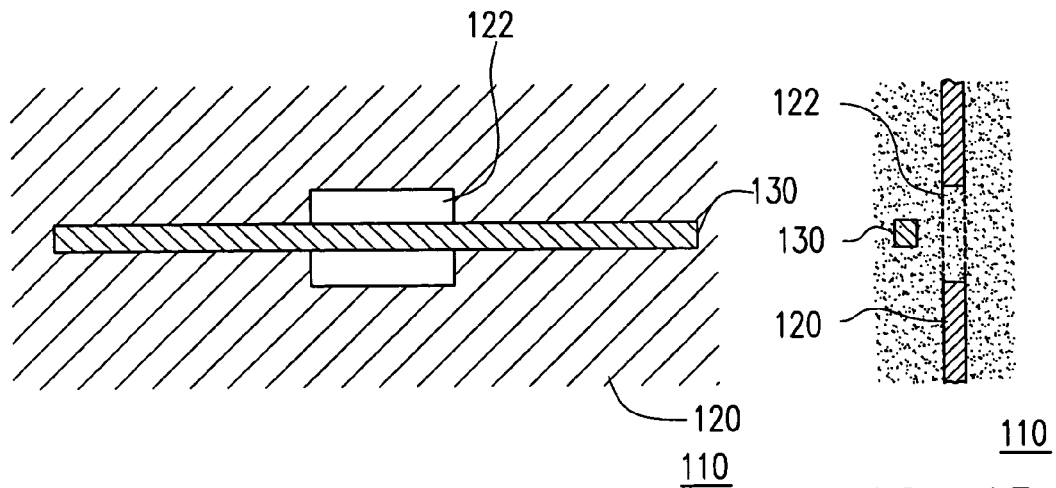
FIGS. 1A and 1B show a top view and a side view of a conventional signal line through a non-reference area.
Figure 2A:
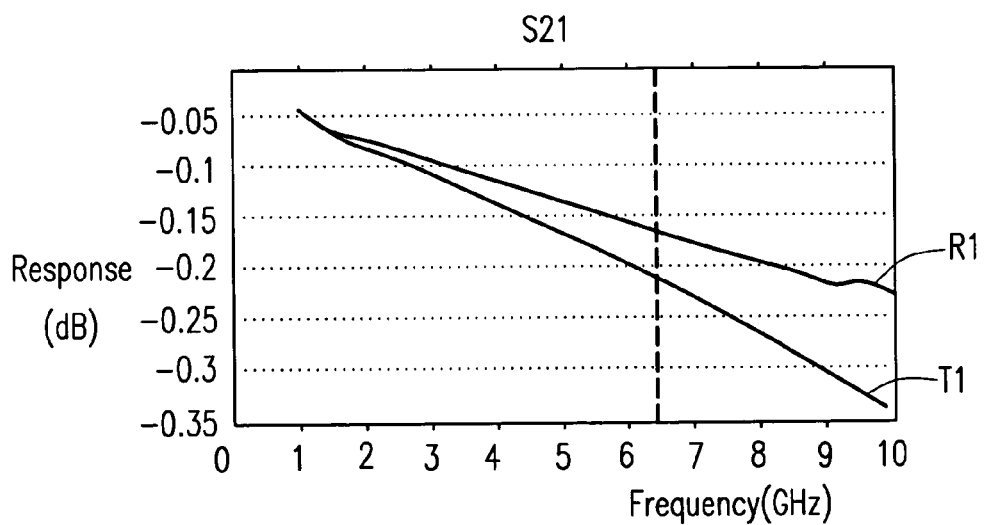
FIG. 2A shows the frequency response S21 when the conventional signal line passes through a reference plane and a non-reference area.
Figure 2B:
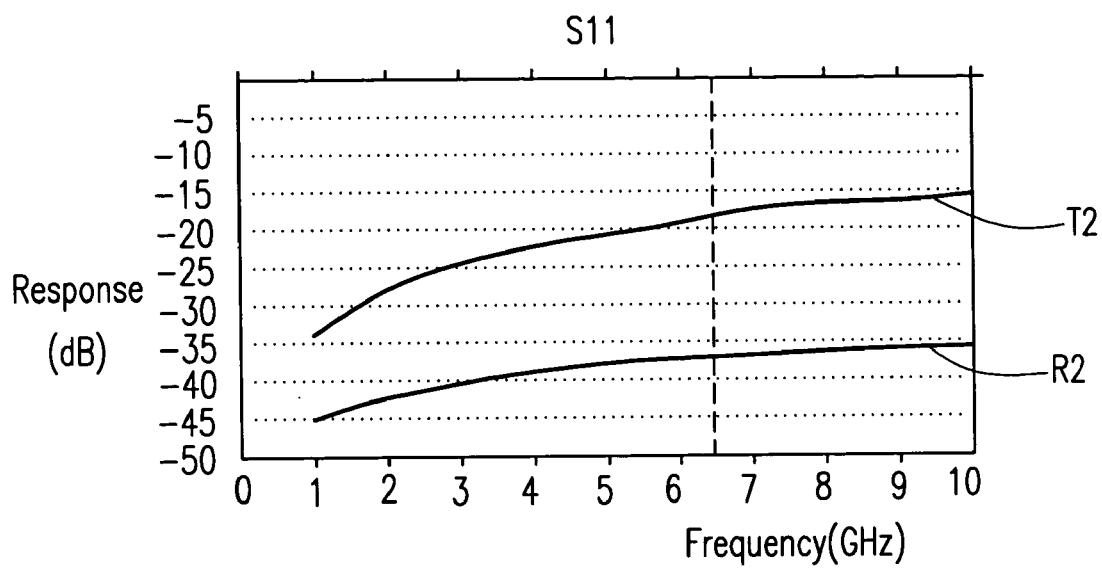
FIG. 2B shows the frequency response S11 when the conventional signal line passes through a reference plane and a non-reference area.
Figure 2C:
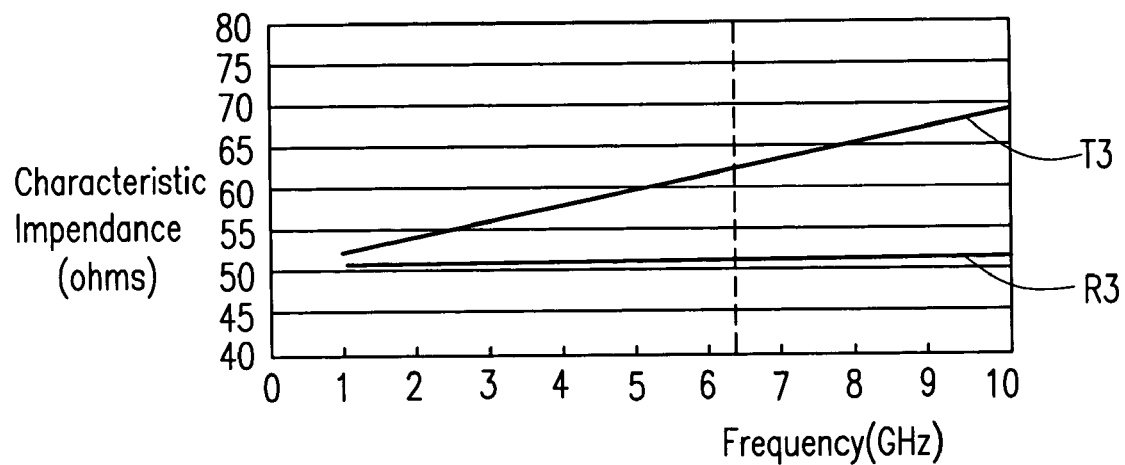
FIG. 2C shows the relationship between the frequency and the characteristic impedance when the conventional signal line passes through a reference plane and a non-reference area.
Figures 3A, 3B:
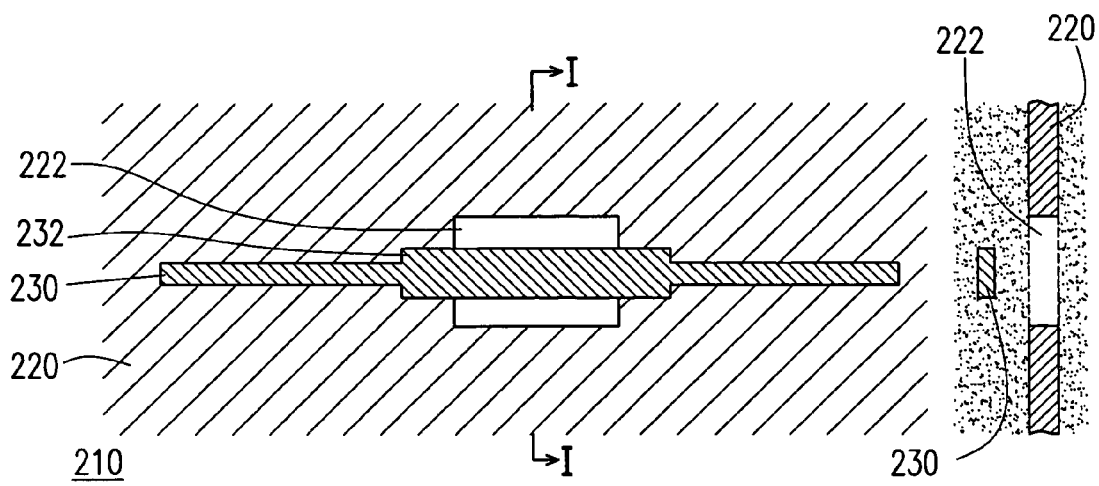
FIGS. 3A and 3B show a top view and a cross-sectional view (along the I—I line) of a signal transmission structure for a circuit board in accordance with a preferred embodiment of the present invention.

FIGS. 3A and 3B show a top view and a cross-sectional view (along the I—I line) of a signal transmission structure for a circuit board in accordance with a preferred embodiment of the present invention. The signal transmission structure 210 is for a circuit board such as a printed circuit board or a packaging structure. The signal transmission structure 210 includes at least a signal line 230 and a reference plane 220. The signal line 230, for example, can be above the reference plane 220; and the signal line 230 and the reference plane 220 are overlapped but not co-planar. Further, the reference plane 220 can be a power plane or a ground plane, and a portion of reference plane 220 forms a non-reference area 222 such as a non-reference opening due to hole drilling or cutting. As a consequence, , this embodiment locally widens the area of the signal line 230 through the non-reference area 222 to prevent the high impedance at the non-reference area 222 when signals are transmitted on the signal line 230i.e., a salient 232 extends above the non-reference area, and a portion of the salient 232 can also extend to an area outside the non-reference area 222. Therefore, the increased parasitic capacitance between the salient 232 and the reference plane 220 can improve the impedance mismatch when the signals pass through the salient 232.

To calculate the impedance of the signal line, the characteristic impedance Z is approximately equal to $$Z = \sqrt{\frac{L}{C}},$$

wherein L is the equivalent inductance of the signal line, and C is the equivalent capacitance of the signal line. In the conventional design, the equivalent inductance L of the signal line is increased when the signals pass through the non-reference area, thereby increasing the characteristic impedance Z. However, this embodiment increases the equivalent capacitance C of the signal line 230 so that the characteristic impedance Z can be reduced because of the increase of the parasitic capacitance at the non-reference area 222. As a result, the characteristic impedance Z of the signal line becomes uniform by locally compensating the characteristic impedance.

Because the equivalent capacitance C of the signal line 230 is proportional to the area A between the signal line 230 and the reference plane 220 and is inversely proportional to the distance d between the signal line 230 and the reference plane 220, the equivalent capacitance C can be increased by either increasing the area A or reducing the distance d between the signal line 230 and the reference plane 220. Hence, the parasitic capacitance increased due to the salient 232 can effectively improve the impedance mismatch of the signal line 230 when the signals pass through the widened salient 232 of the signal line 230.

Figure 4A:
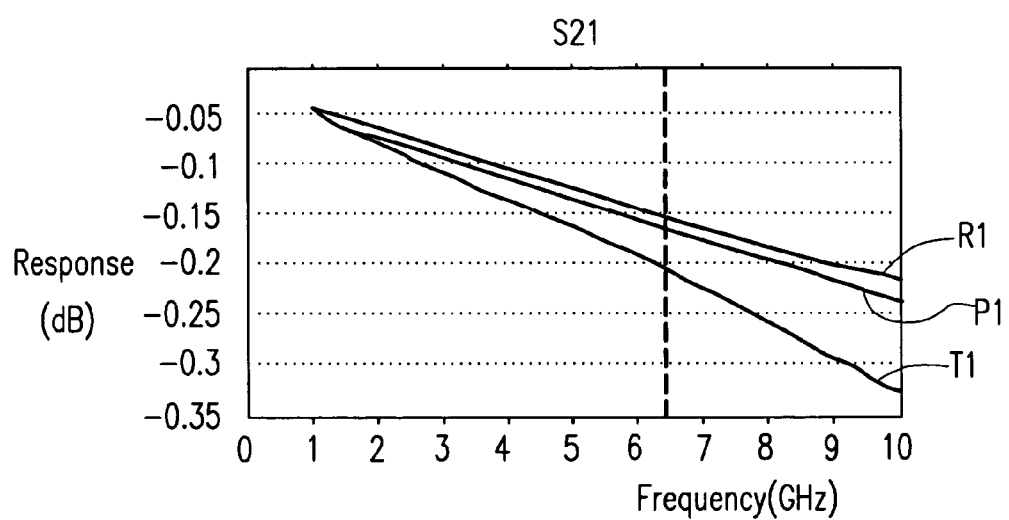
FIG. 4A shows the frequency response S21 when the signal line of the present invention and the conventional signal line pass through a non-reference area.

FIG. 4A shows the frequency response S21 when the signal line of the present invention and the conventional signal line pass through a non-reference area. Referring to FIGS. 3A and 4A, the insertion loss is high when the working frequency is high. This happens when the conventional signal line 132 passes through a non-reference area 122 as shown in T1 so that the distortion is more serious. In one embodiment of the present invention, the signal line 230 of the present invention can reduce the insertion loss when the signal line 230 of the present invention passes through the non-reference area 222 as shown in P1 and is very close to the ideal reference plane as shown in R1.

Figure 4B:
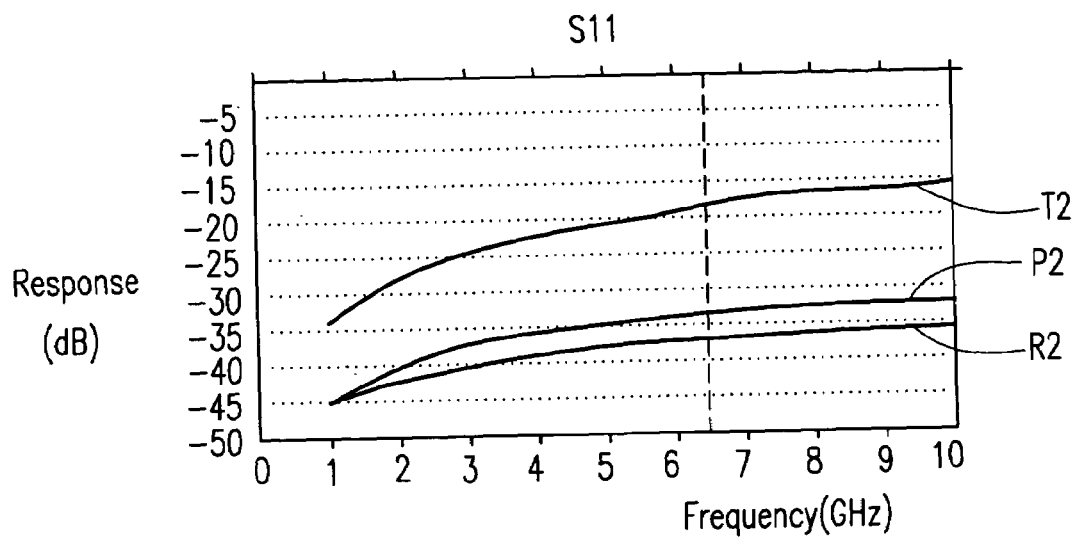
FIG. 4B shows the frequency response S11 when the signal line of the present invention and the conventional signal line pass through a non-reference area.

FIG. 4B shows the frequency response S11 when the signal line of the present invention and the conventional signal line pass through a non-reference area. Referring to FIGS. 3B and 4B, the return loss is more reduced when the working frequency is high. This is due to the conventional signal line 132 passing through a non-reference area 122 as shown in T2 so that the distortion is more serious. In another embodiment of the present invention, the signal line 230 of the present invention can increase the insertion loss when the signal line 230 passes through the non-reference area 222 as shown in P2 and is very close to the ideal reference plane as shown in R2.

Figure 4C:
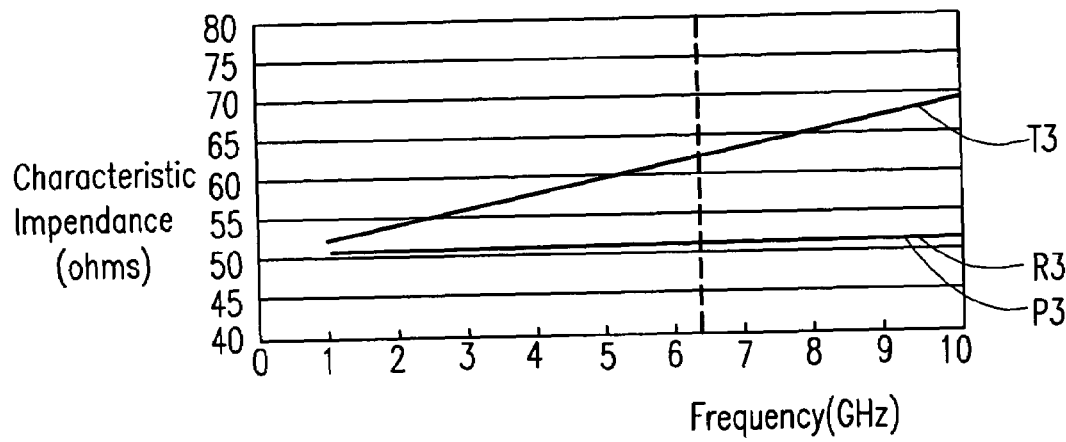
FIG. 4C shows the relationship between the frequency and the characteristic impedance when the signal line of the present invention and the conventional signal line pass through a non-reference area.

FIG. 4C shows the relationship between the frequency and the characteristic impedance when the signal line of the present invention and the conventional signal line pass through a non-reference area. Referring to FIGS. 3C and 4C, the characteristic impedance is high when the working frequency is high. This is due to the conventional signal line pass through a non-reference area 122 as shown in T2. As a result, the impedance mismatch occurs. In another embodiment of the present invention, the signal line 230 can reduce the characteristic impedance at the non-reference area 122 when the signal line 230 passes through the non-reference area 222 as shown in P3 and is very close to the ideal reference plane as shown in R3.

Figures 5A, 5B:
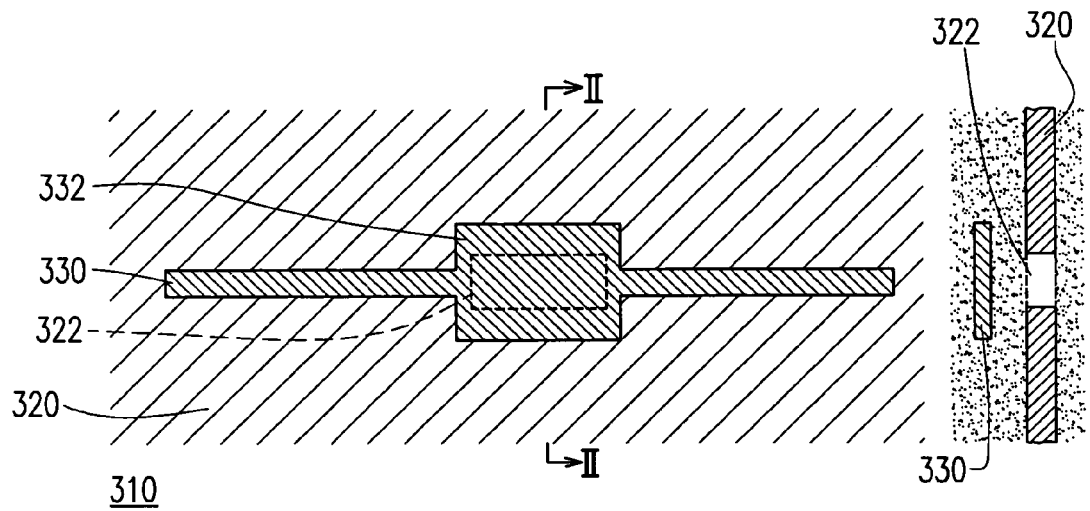
FIGS. 5A and 5B show a top view and a cross-sectional view (along the II—II line) of a signal transmission structure for a circuit board in accordance with another preferred embodiment of the present invention.

FIGS. 5A and 5B show a top view and a cross-sectional view (along the II—II line) of a signal transmission structure for a circuit board in accordance with another preferred embodiment of the present invention.

The signal transmission structure 310 is for a circuit board. The signal transmission structure 310 includes at least a signal line 330 and a reference plane 320. The signal line 330, for example, can be above the reference plane 320, and the signal line 330 and the reference plane 320 are overlapped but not co-planar. Further, the salient 332 of the signal line 30 can be widened and extended longer to completely cover the non-reference area 322 without affecting the layout density of the adjacent signal lines. Moreover, a portion of the salient 332 can extend to an area outside the non-reference area 322 so that the area of the salient 332 is larger than that of the non-reference area 322, and therefore, the salient 322 is able to encircle the circumference of the non-reference area 322. Therefore, the characteristic impedance Z of the signal line 330 becomes uniform by locally compensating the characteristic impedance by increasing the equivalent capacitance C of the salient 332 of the signal line 330.

Figures 6A, 6B:
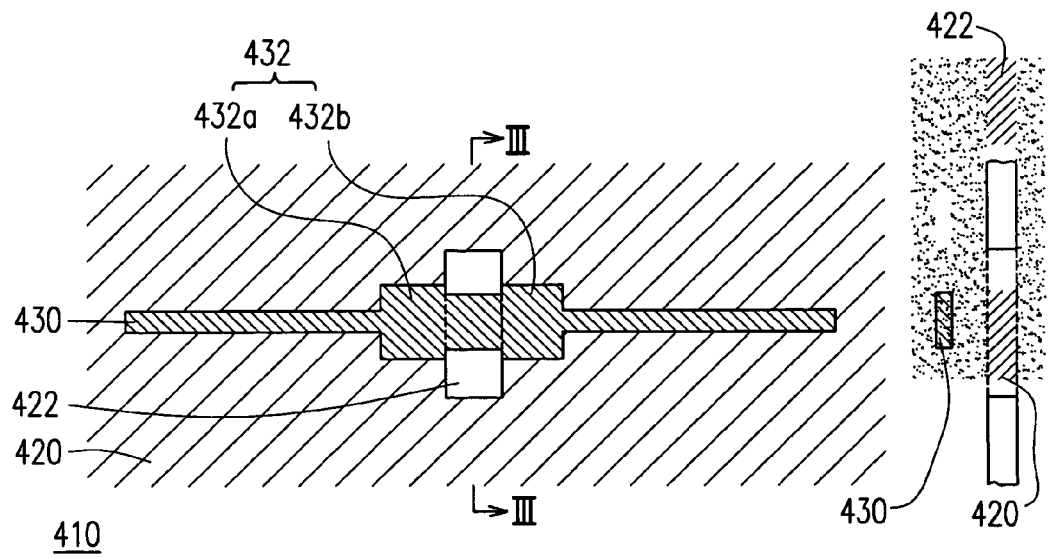
FIGS. 6A and 6B show a top view and a cross-sectional view (along the III—III line) of a signal transmission structure for a circuit board in accordance with another preferred embodiment of the present invention.

FIGS. 6A and 6B show a top view and a cross-sectional view (along the III—III line) of a signal transmission structure for a circuit board in accordance with another preferred embodiment of the present invention. The signal transmission structure 410 includes at least a signal line 430 and a reference plane 420. The signal line 430, for example, is above the reference plane 420, and the signal line 430 and the reference plane 420 are overlapped but not co-planar. The signal line has a salient 432. The salient 432 includes a first salient portion 432a and a second portion 432b. The first salient portion 432a is on one side of the non-reference area 422 corresponding to an extended direction of the signal line 430, and the second salient portion 432b is on the opposite side of the first salient portion 432a so that the salient 432 is distributed in a dumbbell shape over the two sides of the non-reference 422. Therefore, the characteristic impedance Z of the signal line 430 becomes uniform by locally compensating the characteristic impedance by increasing the equivalent capacitance C of the salient 432 of the signal line 430.

Figure 7:
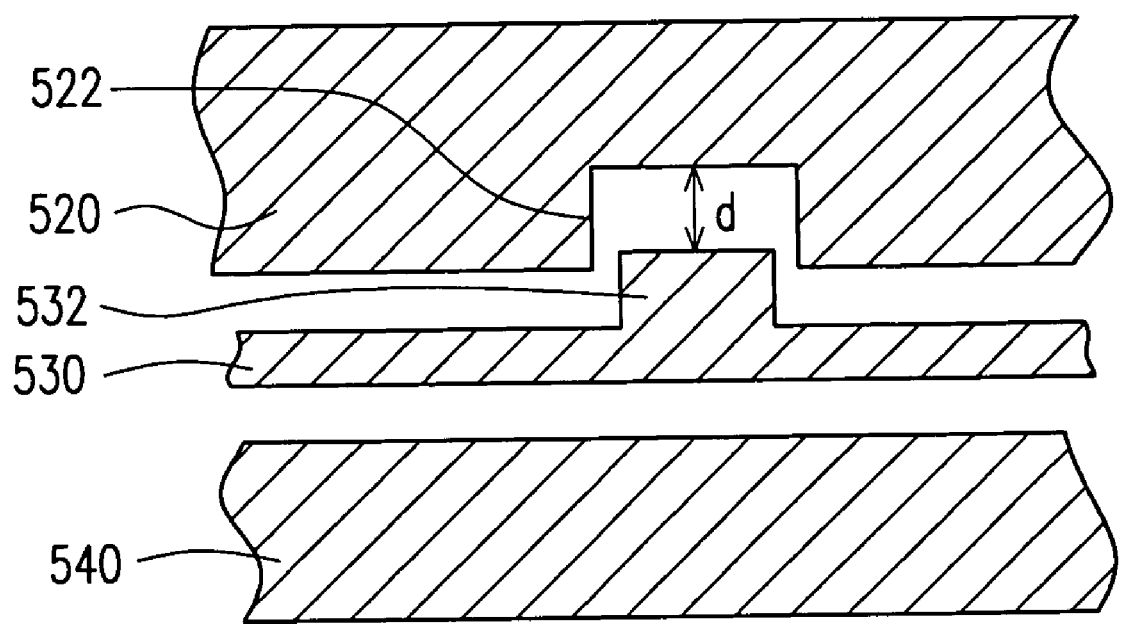
FIG. 7 shows a cross-sectional view of a signal transmission structure for a circuit board in accordance with still another preferred embodiment of the present invention.

FIG. 7 shows a cross-sectional view of a signal transmission structure for a circuit board in accordance with still another preferred embodiment of the present invention. The signal transmission structure 510 includes at least a signal line 530 and two reference planes 520 and 540. The signal line 530 is co-planar with the reference planes 520 and 540, and the reference plane 520 has an opening 522. The opening 522 is on a lateral side of the reference plane 520 adjacent to the signal line 530. The opening 522 forms the non-reference area. Further, the signal line has a salient 532 extending into the opening 522 and keeping a distance d away from the reference plane 520. Therefore, the characteristic impedance Z of the signal line 530 becomes uniform by locally compensating the characteristic impedance by increasing the equivalent capacitance C of the salient 532 of the signal line 530 (because of the decrease of the distance d).

To summarize, the signal transmission structure of the present invention includes at least a signal line and a reference plane. The reference plane has a non-reference area. The signal line is on a side of the reference plane including a salient positioning corresponding to the non-reference area and protruding from a lateral side of the signal line. The reference plane is one of a power plane and a ground plane. The reference plane and the signal line can be overlapped but not co-planar, alternatively the reference plane and the signal line can be co-planar. A portion of the salient partially extends to an area outside the non-reference area when the reference and the signal lines are overlapped. The characteristic impedance of the signal line becomes uniform by using the salient of the signal line to compensate the characteristic impedance and to achieve the impedance match. The salient extends into the opening of the reference plane forming a distance in between the salient and the reference plane when the reference plane and the signal line are co-planar. The opening forms the non-reference area. Thus, the characteristic impedance of the signal line becomes uniform by using the salient of the signal line to compensate the characteristic impedance and to achieve the impedance match.

In light of the above, the signal transmission structure of the present invention has the following advantages 1. The present invention can overcome the high impedance generated when the signals pass through the non-reference area by increasing the equivalent capacitance of the salient. Therefore, the characteristic impedance of the signal line becomes uniform by locally compensating the characteristic impedance.

2. The present invention can increase the reduction of the return loss when the signals pass through the non-reference area by increasing the equivalent capacitance of the salient.

3. The present invention can reduce the insertion loss when the signals pass through the non-reference area by increasing the equivalent capacitance of the salient.

4. The signal transmission structure of the present invention can be widely applied in a printed circuit board with a large scale or a packaging substrate.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A signal transmission structure for a circuit board, comprising:
   a reference plane having a non-reference area; and
   a signal line on a first side of said reference plane, wherein said signal line having at least a salient positioning corresponding to said non-reference area and protruding from a lateral side of said signal line, wherein said reference plane and said signal line are co-planar, and wherein said reference plane has an opening, said opening being on a lateral side of said reference plane that adjacent to said signal line forming said non-reference area, said salient extending into said opening forming a distance in between said salient and said reference plane.

2. The signal transmission structure of claim 1, wherein said reference plane is one of a power plane and a ground plane.

3. The signal transmission structure of claim 1, wherein said reference plane and said signal line are overlapped.

4. The signal transmission structure of claim 3, wherein a portion of said salient partially extends to an area outside said non-reference area.

5. The signal transmission structure of claim 3, wherein said salient includes a first salient portion and a second salient portion, said first salient portion being on a side of said non-reference area that corresponding to said extended direction of said signal line, and said second salient portion being on the opposite side of said first salient portion.

6. A signal transmission structure comprising:
   a reference plane having an opening; and
   a signal line having a wider width region, wherein said wider width region including a salient for increasing a parasitic capacitance when said signal line protruding into opening, wherein said reference plane and said signal line are co-planar, and wherein said reference plane has an opening, said opening being on a lateral side of said reference plane that adjacent to said signal line forming said non-reference area, said salient extending into said opening forming a distance in between said salient and said reference plane.

7. The signal transmission structure of claim 6, wherein the width of said salient is larger than the width of said opening.

8. The signal transmission structure of claim 6, wherein said salient encircles a circumference of said opening.

9. The signal transmission structure of claim 6, wherein said salient is distributed in a dumbbell shape over two sides of said opening.

* * * * *